United States Patent [19]

Muraoka

[11] Patent Number: 5,034,727
[45] Date of Patent: Jul. 23, 1991

[54] MONITOR SYSTEM FOR A CONNECTION OF A CONNECTOR IN AN ELECTRIC SYSTEM OF A MOTOR VEHICLE

[75] Inventor: Kunihiko Muraoka, Isezaki, Japan

[73] Assignee: Fuji Jukogyo Kabushiki Kaisha, Tokyo, Japan

[21] Appl. No.: 438,756

[22] Filed: Nov. 17, 1989

[30] Foreign Application Priority Data

Nov. 25, 1988 [JP] Japan .......................... 63-154154[U]

[51] Int. Cl.$^5$ ............................................. G08B 21/00
[52] U.S. Cl. .................................... 340/652; 340/687; 307/10.1; 439/490
[58] Field of Search ............ 340/687, 428, 431, 457.1, 340/652, 568, 571; 324/503, 538; 307/10.1; 361/100; 439/488-491, 911, 917; 200/DIG. 24

[56] References Cited

U.S. PATENT DOCUMENTS

| | | | |
|---|---|---|---|
| 3,697,974 | 10/1972 | Harris et al. ........................ | 340/431 |
| 4,127,855 | 11/1978 | Toner .................................. | 340/687 |
| 4,674,814 | 6/1987 | Hoshino et al. ..................... | 439/489 |
| 4,915,648 | 4/1990 | Takase et al. ....................... | 439/489 |
| 4,927,382 | 5/1990 | Huber .................................. | 340/687 |

FOREIGN PATENT DOCUMENTS 53-101638 8/1978 Japan .
59-2148 1/1984 Japan .

Primary Examiner—Joseph A. Orsino
Assistant Examiner—Jill Jackson
Attorney, Agent, or Firm—Martin A. Farber

[57] ABSTRACT

A connector has a male connecting member and a female connecting member. A monitor element comprising a resistor and a switch which are connected in series is provided in the male connecting member. The switch is provided to be opened when the connector is in a completely connected state. A monitoring circuit including the monitor element having a pair of output terminals at ends of the circuit is provided for detecting voltage across the output terminal. A change of the voltage upon the disconnection of the connector is signaled.

7 Claims, 3 Drawing Sheets

MONITOR SYSTEM FOR A CONNECTION OF A CONNECTOR IN AN ELECTRIC SYSTEM OF A MOTOR VEHICLE

BACKGROUND OF THE INVENTION

The present invention relates to a system for monitoring connectors provided in an electric system of a motor vehicle, and more particularly to a monitor for connectors employed in an air-bag system of the motor vehicle.

The air-bag system is provided in a motor vehicle for protecting the driver and passenger in case of a front end crash of the vehicle. The air-bag system has an air bag folded and packed in a housing mounted on a steering wheel and an inflator provided on the steering wheel for inflating the air bag. The inflator has a squib as a heating element, and an air bag operating circuit including a source, g-responsive sensors, and a rotatable connector for electrically connecting these components to each other. Upon a crash current from the source is supplied to the squib to heat pulverized chemicals in the inflator to explode it, so that the air bag is inflated.

Manual connectors are provided for connecting leads in the air-bag operating circuit between the squib and sensors. These connectors must be coupled with utmost care on an assembly line of a motor vehicle factory.

If one of the manual connectors is disconnected, the air bag does not operate in an emergency. Therefore, the connections of the connectors are checked on the assembly line.

FIG. 6 shows a conventional connector comprising male and female connecting members $C_1$ and $C_2$. A plurality of projections are provided on both the members $C_1$ and $C_2$, which form a predetermined bar code m when coupling. If the connecting members are completely joined, the predetermined bar code m can be read by a reader. If the predetermined bar code m can not be read, it is determined that the connector is incompletely joined.

In the conventional systems, the joining state of the connector can be inspected only on the assembly line or by a dealer at an auto shop. The connector which was disconnected and re-connected by a user cannot be checked by the user, because he can not read the bar code. Further, if the jointed connector comes loose, the driver can not find out about such an abnormality. Therefore, the conventional connector has a fatal serious defect.

SUMMARY OF THE INVENTION

The object of the present invention is to provide a monitor for a connector of a motor vehicle which may automatically detect the disconnection of the connector after the assembling of the motor vehicle.

Other objects and features of this invention will become understood from the following description with reference to the accompanying drawings.

DETAILED DESCRIPTION OF THE PREFERRED EMBODIMENTS

Figure 1:
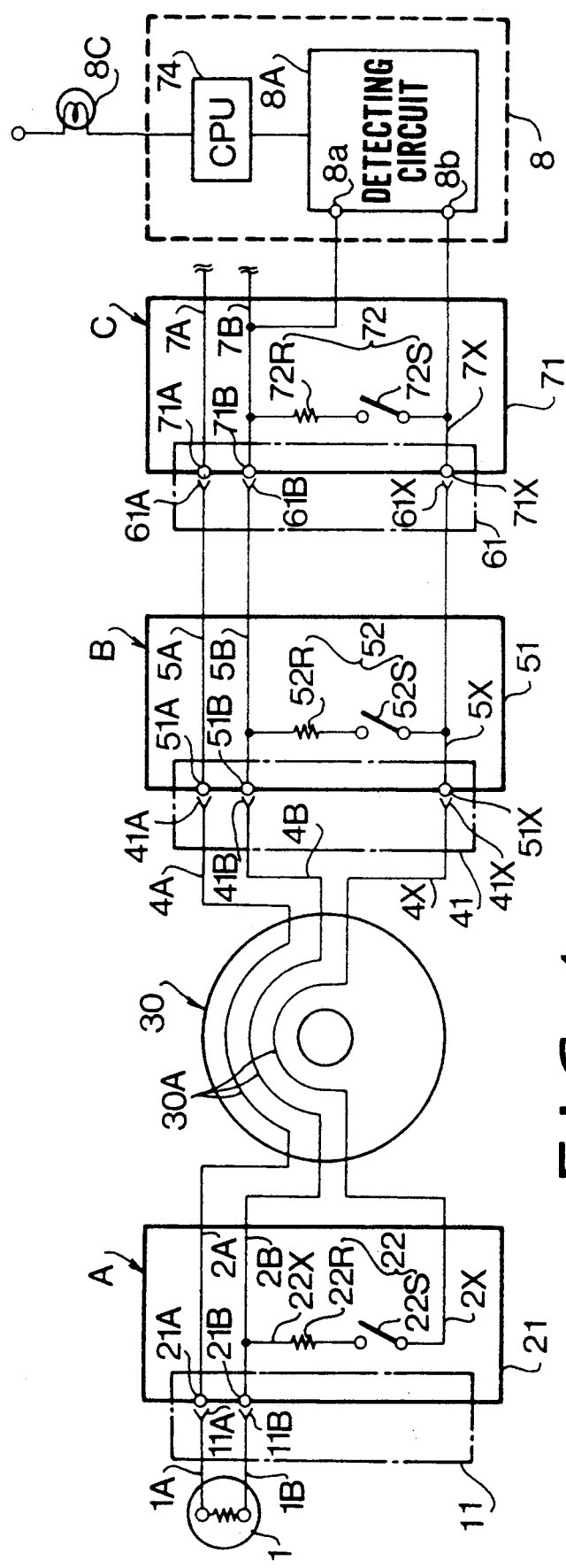
FIG. 1 shows an air-bag control system having a connector monitoring system for a motor vehicle according to the present invention.
Figure 6:
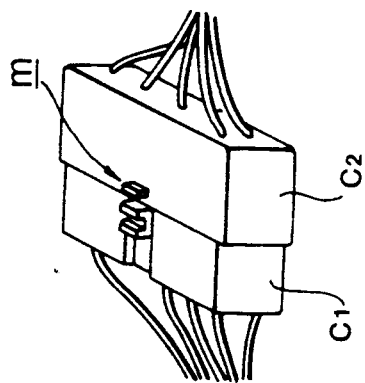
FIG. 6 is a perspective view showing a conventional connector.

Referring to FIG. 1, the air-bag control system has first to third connectors A, B and C. An inflator 1 of the air-bag control system has a pair of leads 1A and 1B which are connected to terminals 11A and 11B of a female connecting member 11 of the first connector, respectively. The terminals 11A and 11B are coupled to terminals 21A and 21B of a male connecting member 21 for a rotatable connector 30, respectively. The terminal 21A and 21B are connected to leads 2A and 2B in the connecting member 21, respectively. The male connecting member 21 is provided with a monitor element 22 comprising a switch 22S and a resistor 22R connected to the switch 22S in series. The resistor 22R is connected to the lead 2B through a lead 22X. The switch 22S is connected to a monitor lead 2X.

Figure 3:
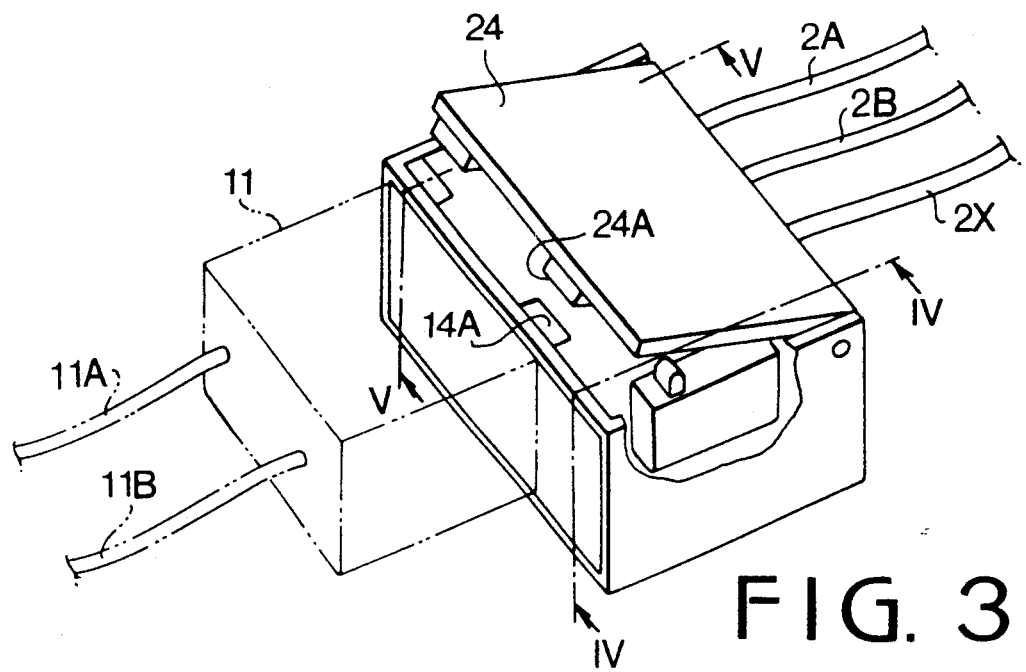
FIG. 3 is a schematic perspective view showing a connector according to the present invention.
Figure 4:
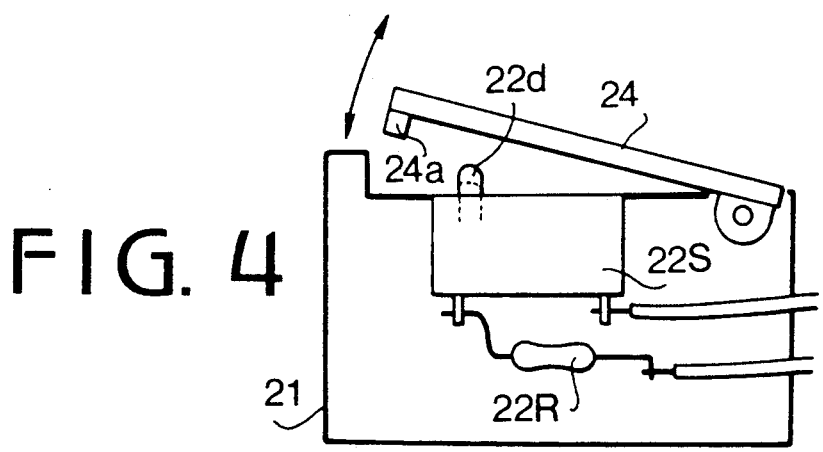
FIG. 4 is a sectional view taken along a line IV—IV of FIG. 3.
Figure 5:
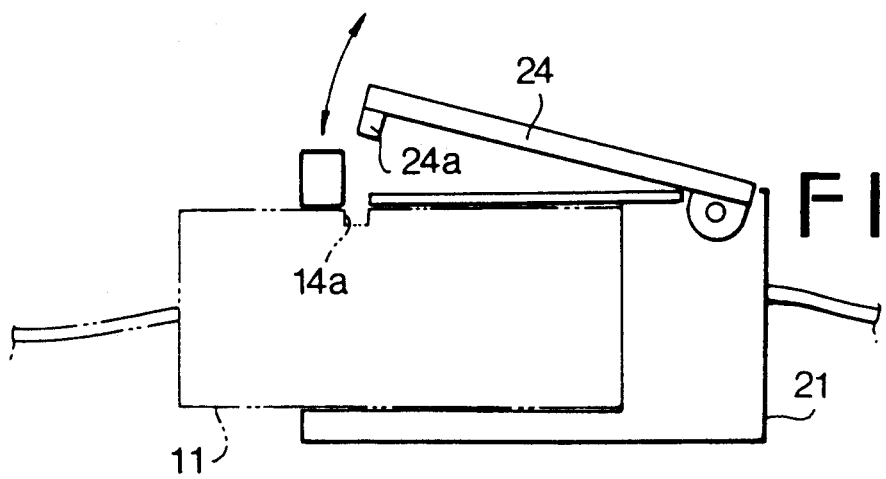
FIG. 5 is a sectional view taken along a line V—V of FIG. 3.

As shown in FIGS. 3 to 5, the male connecting member 21 has a double lock lever 24 with locking 24a, and the female connecting member 11 has notches 14a. When the double lock lever 24 is rotated toward the female connecting member 11 to close the male connecting member, the projections 24a engage with notches 14a to lock the connecting member 11. Under the closed condition, the lever 24 pushes an actuating rod 22d of the switch 22S to open the switch. If the male connecting member 21 is incomplete, the switch 22S is turned on.

The leads 2A, 2B and 2X of the male connecting member 21 are connected to the leads of a cable 30A in the rotatable connector 30. The other ends of leads of the cable 30A are connected to leads 4A, 4B and 4X which are connected to terminals 41A, 41B and 41X of a female connecting member 41 of the second connector B. Terminals 41A, 41B and 41X are coupled to terminals 51A, 51B and 51X of a male connecting member 51 having the same construction as the male connecting member 21. The terminals 51A, 51B and 51X are connected to the leads 5A, 5B and 5X, respectively. The male connecting member 51 is provided with a monitor element 52 comprising a switch 52S and a resistor 52R connected to the switch 52S in series. The switch 52S is connected to the lead 5X and the resistor 52R is connected the lead 5B. Similar to the connecting members 11 and 21, the switch 52S is opened when the connecting members 41 and 51 are completely coupled with each other.

The leads 5A, 5B and 5X are connected to terminals 61A, 61B and 61X of a female connecting member 61 of the third connector C. The terminals 61A, 61B and 61X are coupled to terminals 71A, 71B and 71X of a male connector 71 of a control unit 8, respectively. The terminals 71A, 71B and 71X are connected to leads 7A, 7B and 7X which are in turn connected to the control unit 8. The male connecting member 71 has the same construction as the other male connecting member and is provided with a monitor element 72 comprising a switch 72S and a resistor 72R connected to the switch 72S in series. The switch 72S is connected to the lead 7X and the resistor 72R is connected to the lead 7B.

The leads 7B and 7X are connected to output terminals 8a of a detecting circuit 8A in the control unit 8.

Thus, a monitoring circuit is formed between the terminals 8a including monitor elements 22, 52 and 72. The detecting circuit 8A detects the voltage across the terminals 8a and produces a signal which is applied to a CPU 74. The CPU 74 operates to determine an incomplete joining state of connectors and produces a signal to turn on an alarm lamp 8c.

The voltage at the terminals 8a is dependent on the resistance between the terminals. If all of the male and female connecting members 21 and 11, 51 and 41, and 71 and 61 in the circuit are completely coupled with each other, which means that all switches 22S, 52S and 72S of the monitors 22, 52 and 72 are opened, the resistance between the terminals 8a is infinity ($\infty$).

In the present invention, the resistors 22R, 52R and 72R are different in resistance. Thus, an incomplete coupling connector can be determined in accordance with the voltage dependent on the resistance which is the value of the resistance of the disconnected male connecting member.

Resistances dependent on the coupling state of connectors are shown in the following table.

| No. | CONNECTOR A | CONNECTOR B | CONNECTOR C | RESISTANCE |
|---|---|---|---|---|
| 1 | ○ | ○ | ○ | $\infty$ |
| 2 | ○ | ○ | × | 72R |
| 3 | ○ | × | ○ | 52R |
| 4 | × | ○ | ○ | 22R |
| 5 | ○ | × | × | 72R · 52R/(72R + 52R) |
| 6 | × | ○ | × | 72R · 22R/(72R + 22R) |
| 7 | × | × | ○ | 52R · 22R/(52R + 22R) |
| 8 | × | × | × | $\dfrac{72R \cdot 52R \cdot 22R}{72R \cdot 52R + 52R \cdot 22R + 22R \cdot 72R}$ |

○ — COMPLETE COUPLING
× — INCOMPLETE COUPLING

Figure 2:
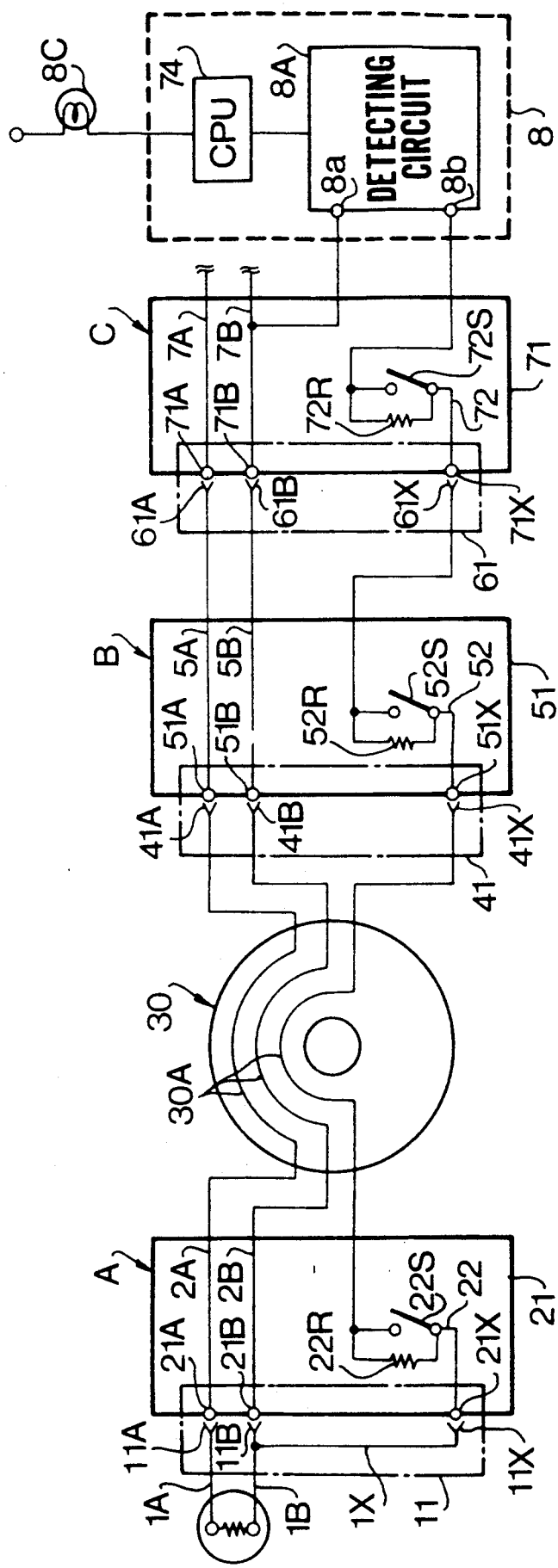
FIG. 2 shows a circuit of another embodiment of the present invention.

Referring to FIG. 2 showing another embodiment of the present invention, the first connector A has additional terminals 11X and 21X. The terminal 11X is connected to the lead 1B by a lead 1X. Each of the monitor elements 22, 52 and 72 comprises a resistor and a switch which are parallel connected with each other. These monitor elements are connected between the lead 1B and the detecting circuit 8A in series.

When all connectors are completely connected, the resistance between the terminals 8a is maximum. If one of the connectors is disconnected, the resistance reduces by the resistance of the disconnected connector.

From the foregoing, it will be understood that the present invention provides a monitor system which detects automatically a disconnection of a connector in the electric circuit and provides an alarm of the disconnection.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A system for monitoring a connection of a connector in an electric system of a motor vehicle, the connector having a couple of connecting members and terminals provided on each connecting member so as to be coupled with terminals of the other connecting member, comprising:

a monitor element comprising a resistor and a switch which are electrically connected with each other and provided in one of the connecting members;

a double lock lever provided on one of the connecting members for engaging with the other connecting member;

actuating means cooperating with the double lock lever for changing the state of the switch so as to change the resistance in the monitor element when the connecting members are incompletely coupled and the double lock lever is not engaged with the other connecting member;

a monitoring circuit including the monitor element and having a pair of output terminals at ends of the circuit;

detector means connected to the output terminals for detecting voltage across the output terminals; and alarm means connected to said detector means and being responsive to voltage dependent on the change of the resistance for alarming of a failure when the connecting members are incompletely coupled.

2. The system according to claim 1, wherein:
the resistor and the switch are connected in series.

3. The system according to claim 1, wherein:
the resistor and the switch are connected in parallel.

4. The system according to claim 1, wherein
said switch is closed when the connecting members are incompletely coupled and the double lock lever is not engaged with the other connecting member.

5. The system according to claim 1, wherein
said switch is opened when the connecting members are completely coupled and the double lock lever is engaged with the other connecting member.

6. The system according to claim 1, further comprising a plurality of said connectors adapted to be connected together, and each of said connectors having said monitor element wherein each said monitor element is connected in parallel with the output terminals, with said resistor of different resistances from that of other of said resistors of the other of said connectors, such that incomplete coupling of the connecting members of any connector is determined by the alarm means by the value of the voltage dependent on the change of the resistance for the corresponding connector.

7. The system according to claim 1, further comprising a plurality of said connectors adapted to be connected together, and each of said connectors having said monitor element wherein each said monitor element is connected in series with each other monitor element and with the output terminals, with said resistor of different resistances from that of other said resistors of the other of said connectors, such that incomplete coupling of the connecting members of any connector is determined by the alarm means by the value of the voltage dependent on the change of the resistance for the corresponding connector.

* * * * *